(12) United States Patent
Hyon et al.

(10) Patent No.: US 10,793,949 B2
(45) Date of Patent: Oct. 6, 2020

(54) SUBSTRATE PROCESSING APPARATUS AND SUBSTRATE PROCESSING METHOD USING THE SAME

(71) Applicant: EUGENE TECHNOLOGY CO., LTD., Yongin-Si, Gyeonggi-Do (KR)

(72) Inventors: Jun Jin Hyon, Gunpo-Si (KR); Sung Tae Je, Yongin-Si (KR); Byoung Gyu Song, Yongin-Si (KR); Yong Ki Kim, Osan-Si (KR); Kyong Hun Kim, Yongin-Si (KR); Chang Dol Kim, Yongin-Si (KR); Yang Sik Shin, Yongin-Si (KR); Jae Woo Kim, Bucheon-Si (KR)

(73) Assignee: EUGENE TECHNOLOGY CO., LTD. (KR)

( * ) Notice: Subject to any disclaimer, the term of this patent is extended or adjusted under 35 U.S.C. 154(b) by 0 days.

(21) Appl. No.: 15/289,903

(22) Filed: Oct. 10, 2016

(65) Prior Publication Data
US 2017/0137938 A1    May 18, 2017

(30) Foreign Application Priority Data
Nov. 17, 2015  (KR) .................. 10-2015-0161409

(51) Int. Cl.
C23C 16/455    (2006.01)
C23C 16/44     (2006.01)
(Continued)

(52) U.S. Cl.
CPC ........ C23C 16/458 (2013.01); C23C 16/4401 (2013.01); C23C 16/4583 (2013.01);
(Continued)

(58) Field of Classification Search
CPC ............. C23C 16/458; C23C 16/4583; C23C 16/4585; H01L 21/67757; H01L 21/67309
See application file for complete search history.

(56) References Cited

U.S. PATENT DOCUMENTS 6,497,734 B1 * 12/2002 Barber ............. H01L 21/67017
29/25.01
2004/0062627 A1    4/2004 Aggarwal et al.
(Continued)

FOREIGN PATENT DOCUMENTS

CN    104981898 A    10/2015
JP     1298724 A    12/1989
(Continued)

Primary Examiner — Karla A Moore
Assistant Examiner — Nathan K Ford
(74) Attorney, Agent, or Firm — Renaissance IP Law Group LLP

(57) ABSTRACT

The present disclosure relates to a substrate processing apparatus and a substrate processing method using the same, and more particularly, to a substrate processing apparatus that is capable of improving a flow of a process gas that is participated in a substrate processing process and a substrate processing method using the same. The substrate processing apparatus in accordance with an exemplary embodiment includes a pre-chamber into a substrate is carried, a process chamber communicating with the pre-chamber and in which a substrate processing process is performed, a substrate boat including a plurality of partition plates that partition a loading space into which the substrate is loaded and to elevate, a gas supply unit configured to supply a process gas to the substrate through a plurality of injection nozzles provided in the process chamber, an exhaust unit configured to exhaust a gas through a plurality of suction holes defined in the process chamber, and a swap guide member provided in the pre-chamber and configured to place the substrate (Continued)

carried into the pre-chamber in the loading space that is partitioned by the plurality of partition plates.

9 Claims, 9 Drawing Sheets

(51) Int. Cl.
*C23C 16/458* (2006.01)
*H01L 21/67* (2006.01)
*H01L 21/677* (2006.01)
*H01L 21/687* (2006.01)
*H01L 21/02* (2006.01)
*H01L 21/673* (2006.01)

(52) U.S. Cl.
CPC .. *C23C 16/45591* (2013.01); *H01L 21/67109* (2013.01); *H01L 21/67748* (2013.01); *H01L 21/67757* (2013.01); *H01L 21/68707* (2013.01); *C23C 16/4585* (2013.01); *H01L 21/0262* (2013.01); *H01L 21/02532* (2013.01); *H01L 21/67309* (2013.01)

(56) References Cited

U.S. PATENT DOCUMENTS

| 2012/0160169 A1* | 6/2012 | Hasegawa | B05D 1/34 |
| | | | 118/725 |
| 2014/0318456 A1* | 10/2014 | Shin | C23C 16/4583 |
| | | | 118/725 |
| 2016/0013086 A1* | 1/2016 | Yang | H01L 21/67303 |
| | | | 414/222.03 |

FOREIGN PATENT DOCUMENTS

| JP | 2005203727 A | 7/2005 |
| JP | 2014214380 A | 11/2014 |
| KR | 20030080548 A | 10/2003 |
| KR | 20050060161 A | 6/2005 |
| KR | 20150116247 A | 12/2005 |
| KR | 101390474 B1 | 5/2014 |
| KR | 101553709 B1 | 9/2015 |
| TW | 201316429 A1 | 4/2013 |
| WO | 2014168331 A1 | 10/2014 |

* cited by examiner (a)  (b)

(a)  (b)

(a)

(b)

123 : 123a, 123b

SUBSTRATE PROCESSING APPARATUS AND SUBSTRATE PROCESSING METHOD USING THE SAME

CROSS-REFERENCE TO RELATED APPLICATION

This application claims priority to Korean Patent Application No. 10-2015-0161409 filed on Nov. 17, 2015 and all the benefits accruing therefrom under 35 U.S.C. § 119, the contents of which are incorporated by reference in their entirety.

BACKGROUND

The present disclosure relates to a substrate processing apparatus and a substrate processing method using the same, and more particularly, to a substrate processing apparatus that is capable of improving a flow of a process gas that is participated in a substrate processing process and a substrate processing method using the same.

In general, substrate processing apparatuses are classified into single wafer-type substrate processing apparatuses capable of processing one substrate and batch-type substrate processing apparatuses capable of processing a plurality of substrates at the same time. Such a single wafer type substrate processing apparatus has a simple structure, but has low productivity. Thus, the batch type substrate processing apparatuses capable of being mass-producing substrates are being widely used.

In the batch-type substrate processing apparatus in accordance with the related art, a plurality of substrates are vertically loaded to perform the processing process. Thus, a predetermined space having a predetermined distance may be defined in upper and lower sides of a substrate at a loading position so that an end-effector of a transfer module places each of the substrates in the loading space. Here, the upper space may provide a substrate loading path and a space through which a process gas flows, and the lower space may provide a space through which the end-effector places the substrate and then gets out of the substrate loading space. Here, the lower space may have a loading space having a predetermined height so that the end-effector places the substrate and then gets out of the substrate loading space. Thus, the upper space through the process gas flows may be limited in expansion. If a sufficient upper space is not secured, the process gas may not uniformly flow along an entire surface of the substrate, and thus, a process thin film may not have a uniform thickness.

To secure the sufficient upper space, since the upper space is expanded in a state in which a height of the lower space is secured to a predetermined height or more, the total height of a substrate boat may increase. Thus, the substrate processing apparatus may increase in size and price.

PRIOR ART DOCUMENTS

Patent Documents

Korean Patent Publication No. 10-2005-0116247

SUMMARY

The present disclosure provides a substrate processing apparatus in which a process gas participated in a substrate processing process is improved in flow by securing a space above a substrate in a loading space to improve process uniformity on an entire surface of the substrate and a substrate processing method using the same.

In accordance with an exemplary embodiment, a substrate processing apparatus includes: a pre-chamber into which a substrate is carried; a process chamber communicating with the pre-chamber and in which a substrate processing process is performed; a substrate boat including a plurality of partition plates to partition a loading space into which the substrate is loaded and to elevate; a gas supply unit configured to supply a process gas to the substrate through a plurality of injection nozzles provided in the process chamber; an exhaust unit configured to exhaust a gas through a plurality of suction holes provided in the process chamber; and a swap guide member provided in the pre-chamber and configured to place the substrate carried into the pre-chamber in the loading space that is partitioned by the plurality of partition plates.

The swap guide member may include: a support part on which the substrate is supported; and a driving part connected to the support part to move the support part.

The support part may include an aligning stepped part on an end thereof on which the substrate is supported.

Each of the partition plates may include a guide slot through which at least a portion of the swap guide member passes when the substrate boat is elevated.

The guide slot may have an area corresponding to 0.1% to 10% of an area of the partition plate.

The substrate boat may further include a connection bar configured to support the partition plate, and the connection bar or the partition plate may include a substrate support tip on which the substrate transferred from the swap guide member is placed.

The substrate processing apparatus may further include a cover plate disposed under the substrate boat to block a path between the pre-chamber and the process chamber by an ascending of the substrate boat.

The pre-chamber may include a gate slit through which the substrate is carried into the pre-chamber and taken out from the pre-chamber, and the swap guide member may be disposed at a height corresponding to the gate slit.

In accordance with another exemplary embodiment, a substrate processing method using a substrate processing apparatus including: a pre-chamber into which a substrate is carried; a process chamber communicating with the pre-chamber and in which a substrate processing process is performed; a substrate boat that loads the substrate in a loading space partitioned in multi stages; and a plurality of swap guide members to place the substrate in the loading space, includes: carrying the substrate into the pre-chamber; transferring the substrate on the plurality of swap guide members; lifting the substrate boat to place the substrate in the loading space; and moving the substrate boat to the process chamber.

The substrate boat may include: a plurality of partition plates partitioning the loading space; and a plurality of connection bars supporting the plurality of partition pates, wherein, in the lifting of the substrate boat, the substrate may be placed on a substrate support tip formed on each of the plurality of connection bars or the plurality of partition plates.

Each of the plurality of partition plates may include a guide slot through which at least a portion of the plurality of swap guide members passes, and in the lifting of the substrate boat, each of the plurality of swap guide members may pass through the guide slot by an ascending of the substrate boat.

The substrate processing method may further include adjusting a distance between the plurality of swap guide members.

BRIEF DESCRIPTION OF THE DRAWINGS

Exemplary embodiments can be understood in more detail from the following description taken in conjunction with the accompanying drawings, in which.

DETAILED DESCRIPTION OF EMBODIMENTS

Figure 1:
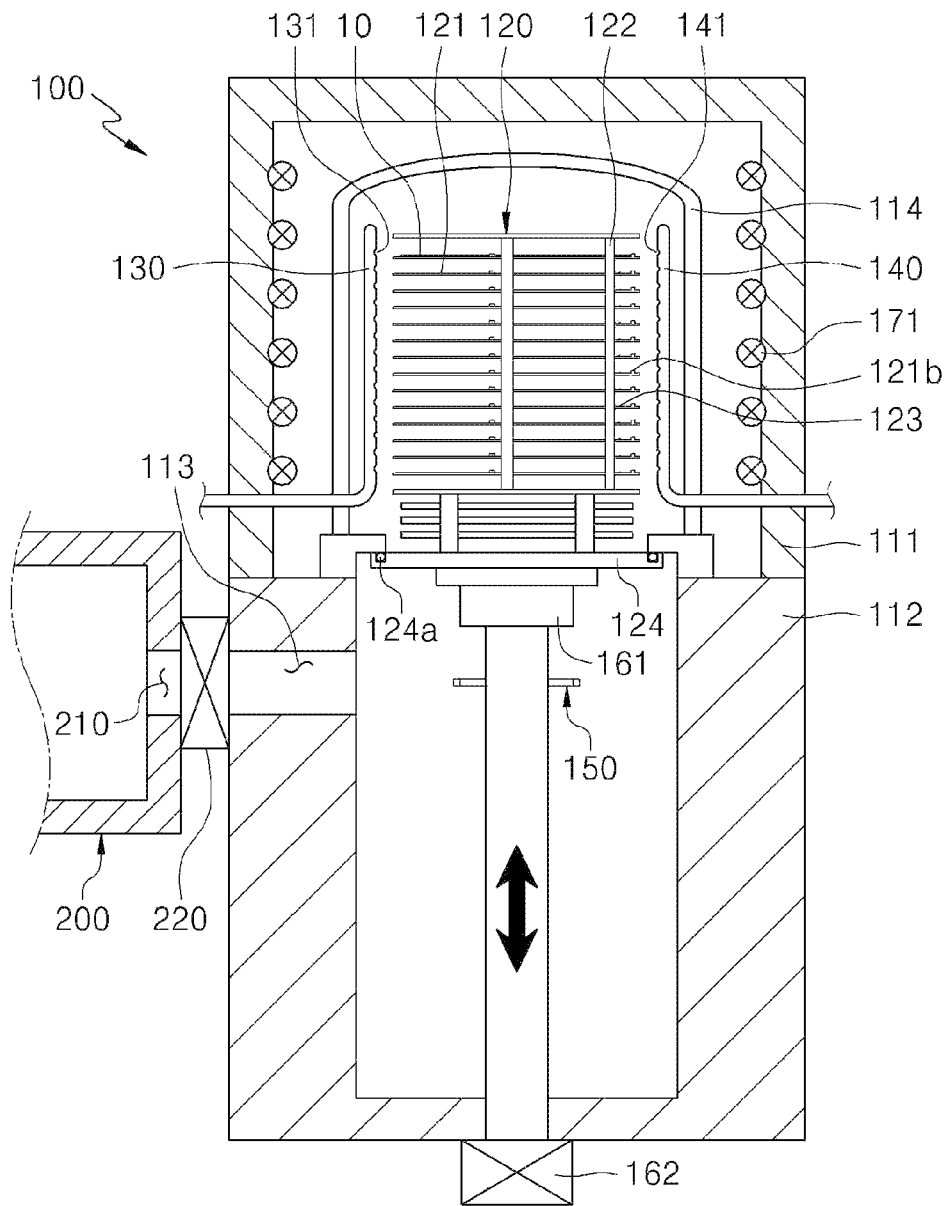
FIG. 1 is a side cross-sectional view of a substrate processing apparatus in accordance with an exemplary embodiment.

Hereinafter, specific embodiments will be described in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. In the descriptions, the same elements are denoted with the same reference numerals. In the figures, the dimensions of layers and regions are exaggerated for clarity of illustration. Like reference numerals refer to like elements throughout.

In the batch-type substrate processing apparatus, a plurality of substrates are vertically loaded to perform the processing process. Thus, a predetermined space having a predetermined distance may be defined in upper and lower sides of a substrate at a loading position so that an end-effector of a transfer module places each of the substrates in the loading space. Here, the upper space may provide a substrate loading path and a space through which a process gas flows, and the lower space may provide a space the which the end-effector places the substrate and then gets out of the substrate loading space. In accordance with the related art, a lower space having a predetermined height, through which the end-effector places the substrate and then gets out of the substrate loading space, may be required. Thus, the upper space through which the process gas flows may be limited in expansion. Thus, the upper space may not be sufficiently secured to cause limitations in which the process gas does not uniformly flow on an entire surface of the substrate, and a process thin film does not have a uniform thickness.

Figure 2:
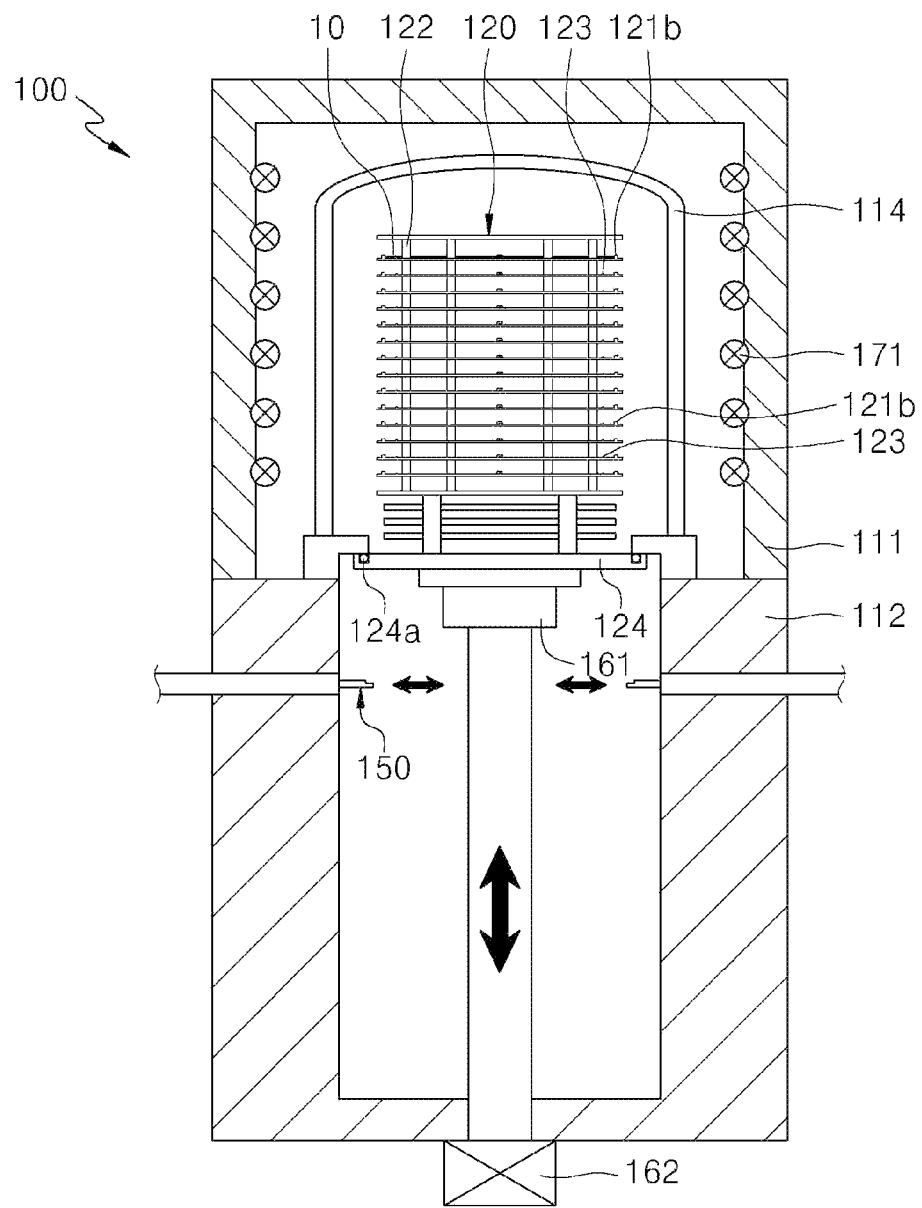
FIG. 2 is a cross-sectional view of the substrate processing apparatus in accordance with an exemplary embodiment.

FIG. 1 is a side cross-sectional view of a substrate processing apparatus in accordance with an exemplary embodiment, and FIG. 2 is a cross-sectional view of the substrate processing apparatus in accordance with an exemplary embodiment.

Referring to FIGS. 1 and 2, a substrate processing apparatus 100 in accordance with an exemplary embodiment may include a pre-chamber 112 into which a substrate 10 is carried, a process chamber 111 communicating with the pre-chamber 112 and in which a substrate processing process is performed, a substrate boat 120 including a plurality of partition plates 121 to partition a loading space in which the substrate 10 is loaded and to elevate, a gas supply unit supplying a process gas to the substrate 10 through a plurality of injection nozzles 131 provided in the process chamber 111, an exhaust unit 140 exhaust gases through a plurality of suction holes 141 provided in the process chamber 111, and a swap guide member 150 provided in the pre-chamber 112 to place the substrate 10 carried into the pre-chamber 112 in the loading space that is partitioned by the plurality of partition plates 121.

The pre-chamber 112 may have a rectangular box or cylindrical shape. The substrate 10 may be carried from a transfer chamber 200, and the carried substrate 10 may be loaded in the substrate boat 120. The pre-chamber 112 may include a gate slit 113 that communicates with the transfer chamber 200 to carry into (or take in) and take out the substrate 10. Thus, the substrate 10 may be carried from the transfer chamber 200 to the pre-chamber through the gate slit 113. An inflow hole 210 may be defined in one side of the transfer chamber 200 to correspond to the gate slit 113. A gate valve may be disposed between the gate slit 113 and the inflow hole 210. Thus, an inner space of the transfer chamber 200 and an inner space of the pre-chamber 112 may be isolated from each other by the gate valve 220. A space between the gate slit 113 and the inflow hole 210 may be opened or closed by using the gate valve 220 to take in and take out the substrate 10.

The process chamber 111 may have a rectangular box shape or cylindrical shape to correspond to the pre-chamber 112 and communicate with the pre-chamber 112. Also, the processing process of the substrate 10 loaded in the substrate boat 120 to move may be performed. The process chamber 111 may include a reaction tube 114 and an external tube (not shown).

the reaction tube 114 may be defined an inner accommodation space in which the substrate boat 120 is accommodated and the processing process of the substrate 10 loaded in the substrate boat 120 is performed. The reaction tube 114 may have a cylindrical shape. Also, the reaction tube 114 may have an opened lower portion in a state in which an upper portion thereof is closed. In this case, when the substrate boat 120 is accommodated in the accommodation space of the reaction tube 114 or vertically elevated to get out of the accommodation space of the reaction tube 114, the substrate boat 120 may be inserted into or withdrawn from the accommodation space of the reaction tube 114 through an opening of the reaction tube 114. Also, a lower portion of the reaction tube 114 may include a protrusion that protrude outward from the circumference of the reaction tube 114 and is connected to the external tube (not shown) or the process chamber 111 so that the reaction tube 114 is connected to and supported by an inner wall of the external tube (not shown) or the process chamber 111.

Also, the reaction tube 114 may provide a substrate processing region in which the substrate processing process is performed. When the substrate boat 120 changes in position to the process position, the substrate boat 120 may be disposed in the substrate processing region, and the substrate processing region may be reduced in volume. In this case, a usage amount of process gas may be minimized, and also, the process gas may be concentrated onto the substrate 10 loaded in the substrate boat 120.

The reaction tube 114 may be formed of ceramic, quartz, or a material in which a metal is coated with ceramic. Also, the reaction tube 114 may have through hoes in a circumference of a sidewall thereof to correspond to the injection nozzle 131 and a suction hole 141. Here, the injection nozzle 131 or the suction hole 141 may be inserted into the through hole to pass.

The external tube (not shown) may have a cylindrical shape and be disposed above the pre-chamber 112 having an opened upper portion or in the process chamber 111. The external tube may be disposed between the process chamber 111 and the reaction tube. The external tube (not shown) may have an inner space in which the reaction tube 114 in which the substrate processing process is performed is accommodated and also may have an opened lower portion. Here, an inner wall of the external tube (not shown) and an outer wall of the reaction tube 114 may be spaced apart from each other to form a space between the external tube (not shown) and the reaction tube 114. However, an exemplary embodiment is not limited to the structure and shape of the external tube (not shown). For example, the external tube may have various structures and shapes.

The substrate 10 may be carried and loaded into the pre-chamber 112 and then elevated through the substrate boat 120 to move the process chamber 111. Then, the substrate 10 may be processed in the process chamber 111. Thus, the inside of the pre-chamber 112 may provide a loading place on which the substrate 10 is loaded, and the inside of the process chamber 111 may provide the substrate processing space. The pre-chamber 112 and the process chamber 111 may be integrated with each other to communicate with each other. An exemplary embodiment is not limited to the structure and shape of each of the pre-chamber 112 and the process chamber 111. For example, each of the pre-chamber 112 and the process chamber 111 may have various structures and shapes.

The substrate boat 120 may load the plurality of substrates 10 in multi stages (or a vertical direction) so as to perform the substrate processing process in a batch type manner. Also, the substrate boat 120 may be elevated within the pre-chamber 112 and the process chamber 111, which communicate with each other to load the substrate or perform the processing process. For example, the substrate boat 120 may load 22 sheets of substrates 10 in multi stage. While the substrate boat 120 is positioned on the loading place (or at the loading position) provided in the pre-chamber 112, the substrate 10 may be loaded into the substrate boat 120. In more detail, when one substrate 10 is loaded on one stage of the substrate boat 120, the substrate boat 120 may ascend to allow the substrate 10 to be loaded on a stage disposed below the stage on which the substrate 10 is loaded. When the plurality of substrates 10 are completely loaded into the substrate boat 120, the substrate boat 120 may move to the inside (or the process position) of the process chamber 111 so that the substrate processing process is performed in the accommodation space of the reaction tube 114.

Also, the substrate boat 120 may include a plurality of partition plates 121 partitioning the loading space in which the substrate 10 is loaded. The plurality of partition plates 121 may define a plurality of individual loading spaces in which the plurality of substrates 10 are respectively loaded so that the plurality of substrates 10 are individually processed in each of the loading spaces. That is, the substrate boat 120 may have multi-stage loading spaces in a vertical direction, and one substrate 10 may be loaded in each of the loading spaces. Thus, the regions for processing the substrate 10 may be individually defined in the loading space of the substrate boat 120 to prevent the process gas injected onto each of the substrates 10 from having an influence on upper and lower substrates. Ceramic, quartz, synthesis quartz, and the like may be used as a material of each of the partition plates 121.

In the batch-type substrate processing apparatus in accordance with the related art, the plurality of substrates may be vertically stacked to perform the substrate processing process. As a result, particles attached to a bottom surface of the substrate may be separated from an end-effector of a transfer module in a single wafer type process or other processes before the substrate processing process to drop onto a layer formation surface of the lower substrate while taking in or out the substrate or during the process, thereby acting as an effect that deteriorates quality of a layer to be grown (hereinafter, referred to as a grown layer).

However, in the substrate processing apparatus 100 in accordance with an exemplary embodiment, the substrate boat 120 including the plurality of partition plates 121 may be used to independently separate the plurality of substrates 10, thereby preventing particles attached to a bottom surface of the substrate 10 from dropping onto a layer formation surface of a lower substrate and thus preventing a grown layer from being deteriorated in quality.

Also, since the batch type substrate processing apparatus in accordance with the related art includes one process gas supply line, only an amount of process gas supplied into the reaction tube may be controlled, but an amount of process gas supplied onto each of the substrates may not be individually controlled. That is, a concentration of the process gas supplied onto each of the substrates is not controlled. As a result, the grown layer formed on the substrate may not be controlled in thickness to form substrates having thicknesses different from each other. Also, to solve this limitation, although a system in which a multi-stage gas supply nozzle and a gas exhaust hole are provided to independently supply a gas to each of the substrates is provided, since the substrate boat has an opened structure between the substrates, the substrate processing may not be performed on the plurality of substrates within the substrate boat. That is, even though a predetermined amount of process gas is supplied through the gas supply nozzle (or the injection nozzle) corresponding to each of the substrates, the process gas may have an influence on a substrate disposed at a corresponding position and substrates disposed above and below the substrate disposed on the corresponding position. Thus, the plurality of substrates within the substrate boat may not be uniformly processed.

However, in the substrate boat 120 in accordance with an exemplary embodiment, the partition plates 121 may be installed between the substrates 10 to independently separate the plurality of substrates 10 to prevent the process gas injected onto each of the substrates 10 from having an influence on the upper and lower substrates.

Also, the substrate boat 120 may further include a connection bar 122 supporting the partition plates 121. The connection bar 122 may be provided in plurality. Thus, a plurality of insertion grooves into which the plurality of partition plates 121 are inserted may be defined in the plurality of connection bars 122. Here, the plurality of insertion grooves may be vertically defined in each of the connection bars 122, and the plurality of partition plates 121 may be respectively inserted into and coupled to the insertion grooves. In this case, a distance (or height) between the partition plates 121 may be simply adjusted through a simple method in which the partition plates 121 are inserted into and withdrawn from the insertion grooves.

The connection bar 122 may connect the plurality of partition plates 121 to each other. While the connection bar 122 stably supports the plurality of partition plates 121 to perform the substrate processing process, the connection bar 122 may prevent the plurality of partition plates 121 from being tilted and each of the loading spaces from being deformed. Also, the plurality of connection bars 122 may be integrally coupled to components of the substrate boat 120 such as the plurality of partition plates 121.

Also, the plurality of connection bars 122 may be symmetrically disposed in a carrying direction (loading direction) of the substrate 10. The plurality of connection bars 122 may be symmetrically disposed to stably support the plurality of partition plates 121 and the substrate 10. When the connection bar 122 covers the carrying diction of the substrate 10, since interference occurs when the substrate 10 is loaded (carried), and the substrate 10 is not loaded, the connection bars 122 may be symmetrically disposed with respect to the carrying direction of the substrate 10.

Here, a distance between the connection bars 122, which are symmetrical to each other and the closest to the gate slit 113 may be greater than an area of the substrate 10. Even though the plurality of connection bars 122 are symmetrically disposed with respect to the carrying direction of the substrate 10, if the distance between the connection bars 122 that are symmetrically to each other and the closest to the gate slit 113 is less than the area of the substrate 10, the loading of the substrate may interfere, and thus, the substrate 10 may not be loaded. Thus, the distance between the connection bars 122 that are symmetrical to each other and the closest to the gate slit 113 may be equal to the area of the substrate 10. If the distance between the connection bars 122 is equal to the area of the substrate 10, since it may be difficult to load the substrate 10, the distance between the connection bars 122 may slightly increase. Here, to allow the distance between the connection bars 122 that are symmetrical to each other and the closest to the gate slit 113 to more increases, the plurality of connection bars 122 disposed at a position that is further than that that is close to the gate slit 113 has to be biasedly disposed. As a result, the plurality of connection bars 122 may be biasedly disposed at a portion that is away from the gate slit 113.

As described above, when the plurality of connection bars 122 are disposed symmetrical to each other in the carrying direction of the substrate 10 so that the distance between the connection bars that are symmetrical to each other and the closest to the gate slit 113 is greater than the area of the substrate 10, the substrate may be easily loaded without interfering when the substrate 10 is loaded. Also, since the plurality of connection bars 122 are disposed symmetrical to each other, the plurality of partition plates 121 and the substrate 10 may be stably supported. In addition, when the process gas is supplied in the carrying direction of the substrate 10, since the process gas flows to an exhaust unit 140 without interfering, the process gas may smoothly flow, and thus, a layer may be effectively grown on the substrate 10.

Also, a height of the lading spaces that are partitioned by the partition plates 121 may change for each loading space and process conditions. Here, a distance between the partition plates 121 may be simply adjusted by a plurality of coupling grooves defined in the connection bars 122. The flow of the process gas may change according to the height of each of the loading spaces. Also, the height of each of the loading space may be adjusted according to supply conditions of the process gas in each of the loading spaces. For example, when the injection nozzles 131 have diameters different from each other, if the injection nozzles 131 gradually increase in diameter, since an injection angle of the process gas increases, the loading space may be adjusted in height according to the diameter of the injection nozzle 131 to prevent the process gas from having an influence on the adjacent loading space. Here, the height of each of the loading space may be proportional to the diameter of the injection nozzle 131.

The process gas may vary in ratio (or concentration) of a raw material gas, an etching gas, a carrier gas, and a dopant gas according to the loading space (or the processing position and the like). Here, when the ratio of the raw material gas, the etching gas, the carrier gas, and the dopant gas varies, since the flow of the process gas varies, the height of each of the loading spaces that are partitioned by the partition plates 121 may be adjusted to adjust the flow of the process gas according to the ratio of the raw material gas, the etching gas, the carrier gas, and the dopant gas. Thus, the plurality of loading space may be different in height from each other.

The gas supply unit 130 may supply the process gas containing the raw material gas and the etching gas onto the plurality of substrates 10 through the injection nozzle 131 provided in the process chamber 111. Here, the injection nozzle 131 may be one linear injection nozzle or a plurality of injection nozzles that are linearly disposed. In case of the plurality of injection nozzles 131 that are linearly disposed, the injection nozzles 131 may be provided for each loading space (i.e., for each of spaces between the plurality partition plates), which are divided by the plurality of partition plates 121. In this case, since one substrate 10 is processed through one injection nozzle 131, the uniform grown layer may be formed on each of the substrates 10. Also, since the process gas is independently supplied to each of the substrates 10, an amount of process gas to be supplied may be controlled according to the situation of each of the substrates. Thus, the processing process may be performed on each of the substrates 10 under the optimal condition, and thus, the grown layer may be improved in quality.

Also, the plurality of injection nozzles 131 that are linearly disposed may be vertically disposed. Also, the plurality of injection nozzles 131 may gradually increase in diameter in a direction that is away from a gas supply source (not shown). For example, when the process gas is supplied upward from a lower side through a single gas supply line, an upper injection nozzle 131a may have a diameter greater than that of a lower injection nozzle 131b.

In detail, in case of the injection nozzle 131 that is close to the gas supply source, the process gas may be supplied from an adjacent position and thus easily introduced. On the other hand, in case of the injection nozzle 131a that is away from the gas supply source, the process gas may be supplied from a distant position, and thus, it may be difficult to supply the process gas when compared to the adjacent injection nozzle 131b. Thus, when the process gas is supplied through the single gas supply line and then distribution by the plurality of injection nozzles 131, amounts of process gas injected from the lower injection nozzle 131b that is close to the gas supply source and the upper injection nozzle 131a that is far away from the gas supply source may be different from each other. Thus, the injection nozzle 131 that is close to the gas supply source may decrease in diameter to reduce an amount of process gas to be injected. Also, the injection nozzle 131a that is far away from the gas supply source may increase in diameter to increase an amount of process gas to be injected. That is, the injection nozzles 131 may be adjusted in diameter so that a uniform amount of process gas is supplied through the injection nozzle 131 that is disposed close to the gas supply source and the inject nozzle 131a that is far away from the gas supply part. Thus, the uniform amount of process gas may be supplied to each of the substrates 10 to improve process efficiency.

The substrate processing apparatus 100 in accordance with an exemplary embodiment may be selective epitaxial growth (SEG) equipment. In the SEG equipment, a small amount of etching gas may be mixed with the raw material gas, and then, the mixture may be supplied. Thus, etching reaction together with deposition reaction may be involved on the substrate. The deposition and etching reaction may occur at the same time at relatively different reaction rates on a polycrystalline layer and an epitaxial layer. During the deposition process, although the epitaxial layer is formed on a mono-crystalline surface while the existing polycrystalline layer or amorphous layer is deposited on at least one second layer, the deposited polycrystalline layer may be generally etched at a rate that is greater than that at the epitaxial layer. Thus, as an etchant gas changes in concentration, a net selective process may result in deposition of an epitaxy material and limited or non-limited deposition of a polycrystalline material. For example, in the SEG equipment, an epilayer formed of a silicon-containing material may be formed on a mono-crystalline silicon surface without allowing the deposited material to remain on a spacer.

In the substrate processing apparatus 100 in accordance with an exemplary embodiment, the epitaxial layer may be formed on the substrate 10. Here, the substrate processing apparatus 100 may be a SEG apparatus. In general, a transfer process, a cleaning process, and an epitaxial process may be performed in the substrate processing equipment. Since a more time is taken to perform the epitaxial process than the cleaning process, manufacturing yield may be improved through the plurality of substrate processing apparatuses 100. The substrate processing apparatus 100 may perform the epitaxial process. When the epitaxial process is performed, the process gas may be supplied into all the processing spaces. The process gas may include at least one of the raw material gas (e.g., a silicon gas), the etching gas, the dopant gas, and the carrier gas. The gases may be mixed at various ratios, and then, the mixture may be supplied to control a thickness of a thin film on the substrate 10. Since the gases have molecular weights different from each other, a flow of the process gas may vary according to the ration of the gases. Thus, in the epitaxial process, the flow of the process gas may be an important factor in determining the thickness and composition of the thin film on the substrate 10.

The epitaxial process may be performed by chemical vapor deposition. The epitaxial process may be performed to form the epitaxial layer on an epitaxy surface. For example, the epitaxy surface on the substrate 10 may be exposed by the process gas including a silicon gas (e.g., $SiCl_4$, $SiHCl_3$, $SiH_2Cl_2$, $SiH_3Cl$, $Si_2H_6$, or $SiH_4$) and a carrier gas (e.g., $N_2$ and/or $H_2$). Also, when the epitaxial layer 76 is required to contain a dopant, the silicon gas may further include a dopant gas (e.g., $AsH_3$, $PH_3$, or $B_2H_6$).

The gas supply unit 130 may supply the process gas containing the raw material gas and the etching gas onto the plurality of substrates 10 through the injection nozzle 131. The process gas may include the raw material gas (e.g., the silicon gas such as $SiCl_4$, $SiHCl_3$, $SiH_2Cl_2$, $SiH_3Cl$, $Si_2H_6$, and $SiH_4$) and the etching gas. Monosilane ($SiH_4$) and dichloro silane (DCS: $SiH_2Cl_2$) may be uses as the raw material gas, and hydrogen chloride (HCl) may be used as the etching gas. The process gas may further include the carrier gas. The carrier gas may dilute a concentration of the raw material gas or the etching gas. Also, at least one of nitrogen ($N_2$) and hydrogen ($H_2$) may be used as the carrier gas. Thus, an amount of carrier gas to be supplied may be controlled to control the concentration of the raw material gas or the etching gas. The raw material gas, the etching gas, and the carrier gas may be easily mixed with each other because the raw material gas, the etching gas, and the carrier gas have molecular weights different from each other. However, the process gas is not limited thereto. For example, the process gas may further include various gases such as the dopant gas. A selective epitaxial growth process involves the deposition reaction and the etching reaction. If it is required that the epitaxial layer includes dopant, the dopant gas (e.g., $AsH_3$, $PH_3$, or $B_2H_6$) may be contained. The etching gas including the hydrogen chloride (HCl) may be used for cleaning as wall as for etching.

Also, the gas supply unit 130 may supply the process gases different from each other on each of the substrates 10. In general, in the batch-type substrate processing apparatus, the same process gas may be supplied to each of the substrates to perform the same substrate processing process on each of the substrates 10. However, in accordance with an exemplary embodiment, the process gases different from each other may be supplied to each of the substrates 10 to form various kinds of grown layers in a single chamber through a single process. Here, the process gas may be different for each substrate 10, different on only a portion of the plurality of substrates 10, or different for each group. Also, the process gas may be supplied through gas supply lines different from each other to each of the loading spaces of the substrate boat 120. Thus, the process gases may be respectively supplied to the substrates 10. If the process gas is different for each group, the same gas supply line may be used for each group. The plurality of injection nozzles 131 may be disposed at heights different from each other to separately supply the gas to each of the loading spaces of the substrate boat 120. Here, the injection nozzle 131b contacting the lower loading space may be disposed at a relatively low height, and the injection nozzle 131a contacting the upper loading space may be disposed at a relatively high height. For example, the plurality of injection nozzles 131 may be spirally disposed along the circumference of the reaction tube 114. In this case, the plurality of injection nozzles 131 may be successively disposed from the injection nozzle 131b that is disposed at the lowest height to the injection nozzle 131*a* that is disposed at the highest height. Thus, when the plurality of injection nozzles 131 having the heights different from each other are regularly disposed, spatial efficiency may be improved when compared to a case in which the plurality of injection nozzles 131 are irregularly disposed. Also, the process gases different from each other may be selectively supplied to the substrates 10 as necessarily through the plurality of injection nozzles 131 that are linearly disposed. Thus, various kinds of grown layers may be formed in the single chamber through the single process.

As described above, in the gas supply unit 130, the injection nozzles 131 may be respectively provided in the plurality of loading spaces of the substrate boat 120 to individually control the process gas in each of the loading spaces.

The gas supply unit 130 may further include a plurality of auxiliary nozzles (not shown) that are respectively provided for the plurality of loading spaces that are partitioned by the plurality of partition plates 121. The plurality of auxiliary nozzles (not shown) may supply an auxiliary gas into the plurality of loading spaces that are partitioned by the plurality of partition plates 121 in the substrate processing process. Here, the plurality of auxiliary nozzles may supply a gas different from the process gas. The plurality of auxiliary nozzles may supply at least one of the dopant gas, the carrier gas, and the etching gas. The dopant gas may be mixed with the raw material gas (e.g., the silicon gas) to deposit the thin film on the substrate 10, and the carrier gas may dilute the concentration of the raw material gas or the etching gas. As a result, when the dopant gas within each of the loading spaces in which the substrates 10 are processed is controlled in concentration, the grown layer (e.g., the silicon thin film) may be individually controlled in doping concentration. Also, when a supply amount of carrier gas to be supplied into each of the loading spaces is controlled, the raw material gas or the etching gas may be individually controlled in concentration for each loading space. Thus, the dopant gas, the carrier gas, and the etching gas may be selectively used through the plurality of auxiliary nozzles to select the substrate processing process for each load space. That is, when only the etching gas is supplied through the plurality of auxiliary nozzles, a mixed ratio of the etching rate within the loading space may increase to perform the etching process so that the selective epitaxial growth is realized on the substrate 10. Also, when only the dopant gas is supplied, a mixed ratio of the dopant gas within the loading space may increase, and thus, the raw material gas and the dopant gas may be mixed with each other to form the thin film on the substrate 10. Also, the process gas supplied into the loading spaces at different ratios due to a different in distance with respect to the gas supply source may be controlled to be supplied into the loading spaces at the same component and molecular weight.

In detailed description with respect to the selective epitaxial growth, when only the etching gas is supplied, or only the etching gas and the carrier gas are supplied, the process gas and the gas supplied through the plurality of auxiliary nozzles may be mixed with each other, and thus, the etching gas within the loading space may increase in ratio. Thus, the thin film may be removed by the etching gas at a portion, on which the thin film is slowly grown, before the thin film is grown. On the other hand, a layer may be deposited before the thin film is removed by the etching gas to form the thin film at a portion on which the thin film is quickly grown. As described above, the etching gas may be controlled in concentration through the plurality of auxiliary nozzles to perform the selective epitaxial process.

Here, when the supply of the gas through the plurality of auxiliary nozzles is stopped, the process gas may be supplied by the injection nozzle 131 to form the thin film (e.g., the silicon thin film) on the substrate 10 within the loading space. Also, the gas may be supplied to each of the auxiliary nozzles through the gas supply lines different from each other. Thus, the dopant gas, the carrier gas, and the etching gas may be selectively supplied for each of the loading spaces. Also, the plurality of auxiliary nozzles may be disposed at heights different from each other to separately supply the gas to each of the loading spaces of the substrate boat 120. Here, the auxiliary nozzle contacting the lower loading space may be disposed at a relatively low height, and the auxiliary nozzle contacting the upper loading space may be disposed at a relatively high height. For example, the plurality of auxiliary nozzles may be spirally disposed along the circumference of the reaction tube 114. In this case, the plurality of auxiliary nozzles may be successively disposed from the auxiliary nozzle that is disposed at the highest height to the auxiliary nozzle that is disposed at the lowest height. Thus, when compared to a structure in which a plurality of auxiliary nozzles disposed at heights different from each other are irregularly disposed, spatial efficiency may be improved.

The exhaust unit 140 may exhaust the residual gas through a plurality of suction holes 141 provided in the process chamber 111. Here, process residues within the process chamber 111 may be exhausted to form vacuum in the process chamber 111. The plurality of suction holes 141 may be defined to correspond to the plurality of injection nozzles 131. The suction holes 141 may be disposed symmetrical to the injection nozzles 131, and the suction hole 141 may have the same number or shape as the injection nozzle 131. The exhaust unit 140 may exhaust the process residues within the process chamber 111. Here, the process residues may include non-reaction gases and reaction byproducts. When the injection nozzle 131 is provided in plurality, the suction hole 141 may be provided in plurality. Here, when the plurality of suction holes 141 are defined symmetrical to the plurality of injection nozzles 131, the process residuals including the non-reaction gas and the reaction byproducts may be effectively exhausted to effectively control the flow of the process gas. That is, an exhaust rate (or exhaust intensity) may be adjusted to control a growth rate of the layer to be grown on the substrate 10. The plurality of suction holes 141 may be defined at heights different from those of the plurality of injection nozzles 131, and each of the suction holes 141 may have a slot-type cross-section to realize effective suction.

The reaction tube 114 may be disposed on the circumference of the reaction tube 114 to stably support the gas supply line and an exhaust line. Thus, a support member (not shown) having a ring shape to support the gas supply line and the exhaust line may be provided on the reaction tube 129. However, the exemplary embodiment is not limited to the structure and shape of the reaction tube 114. For example, the reaction tube 114 may have various structures and shapes.

The swap guide member 150 may be provided in the pre-chamber 112. The swap guide member 150 may primarily support the substrate 10 carried into the pre-chamber 112 to place the substrate 10 in the loading space that is partitioned by the plurality of partition plates 121, thereby loading the substrate 10 in the substrate boat 120. Here, the substrate boat 120 may ascend to place the substrate 10 in the loading space. Alternatively, the swap guide member 150 may be vertically elevated to place the substrate 10 in the loading space. Here, to allow the swap guide member 150 to be vertically elevated, the swap guide member 150 may be completed in structure. Thus, to realize a simple structure, the substrate boat 120 may ascend by using the elevation function of the substrate boat 120 to place the substrate 10 in the loading space.

In accordance with the related art, the substrate is loaded in the loading space by using only the end-effector of the transfer module. Here, since the end-effector supports the substrate by using only one side thereof, the end-effector may have a thick thickness and contact a wide area to support the substrate so as to endure a load of the substrate. Thus, when the end-effector loads the substrate in the loading space and then is horizontally removed without descending, the end-effector may damage a contact surface of the substrate. Thus, a lower space having a predetermined height may be required for providing a space through which the end-effector gets out of the loading space. Thus, the upper space through the process gas flows may be limited in expansion. If a sufficient upper space is not secured, the process gas may not uniformly flow along an entire surface of the substrate, and thus, a process thin film may not have a uniform thickness. Also, to secure the sufficient upper space, since the upper space is expanded in a state in which a height of the lower space is secured to a predetermined height or more, the total height of a substrate boat may increase. Thus, the substrate processing apparatus may increase in size and price.

However, in accordance with an exemplary embodiment, in a state in which the lower space through which the end-effector 20 of the transfer module gets out of the loading space, the substrate carried into the pre-chamber 112 is primarily supported through the swap guide member 150. After the end-effector 20 of the transfer module gets out of the loading space, the substrate boat 120 may ascend, or the swap guide member 150 may be vertically elevated to place the substrate in the loading space of the substrate boat 120. Thus, a loaded position of the substrate 10 loaded in the loading space of the substrate boat 120 may be lowered. In more detail, since the swap guide members 150 support the substrates 10 in the state in which the plurality of swap guide members 150 are disposed symmetrical to each other (e.g., in both directions), each of the swap guide members 150 may have a thickness less than that of the end-effector 20 of the transfer module and support the substrate 10 through a small contact area. As a result, the plurality of swap guide members 150 may contact only a small area of an edge of the substrate 10 to support the substrate. Thus, even though the plurality of swap guide members 150 place the substrate 10 in the loading space and is horizontally removed without descending, the swap guide members 150 may not damage the substrate 10. Thus, the plurality of swap guide members 150 may be removed in only the horizontal direction. Also, since each of the swap guide members 150 has a thickness less than that of the end-effector 20 of the transfer module, the space under the substrate 10 may have a height corresponding to the thickness of the swap guide member 150 that is less than the of the end-effector 20 of the transfer module. Thus, a sufficient space above the substrate 10, through which the process gas flows along the entire surface of the substrate 10 without changing a height of the loading space of the substrate boat 120 or the total height of the substrate boat 120 may be secured. As a result, the flow of the process gas that is participated in the substrate processing process may be improved to improve the process uniformity on the entire surface of the substrate 10. Also, costs required for increasing the height of the loading space and the total height of the substrate boat to secure the sufficient space above the substrate 10 may be reduced.

The swap guide member 150 may be provided in plurality one by one (or more) on left and right sides (both sides). Here, the swap guide member 150 may move or rotate to left and right sides corresponding to each other to adjust a distance therebetween. Here, the distance between the swap guide members 150 may decrease to support the substrate 10 and increase when the substrate boat 120 moves to the process chamber 111. When the swap guide members 150 are disposed on both sides, a moving space through which the end-effector 20 of the transfer module supports the substrate 10 on the swap guide member 150 and then gets out of the loading space may be provided. Here, to prevent the swap guide member 150 from interfering with the substrate 10 when the substrate 10 is loaded or unloaded, the swap guide member 150 may be disposed to avoid a position of the gate slit 113 through the substrate 10 is loaded or unloaded. For example, the swap guide member 150 may be disposed in a direction crossing that in which the substrate 10 is loaded or unloaded.

Also, the swap guide member 150 may be disposed at a height corresponding to the gate slit 113. Thus, the substrate 10 may be supported by the swap guide member 150 through the end-effector 20 of the transfer module without vertically elevating the swap guide member 150, and a moving path of the end-effector 20 may be minimized.

Figure 3:
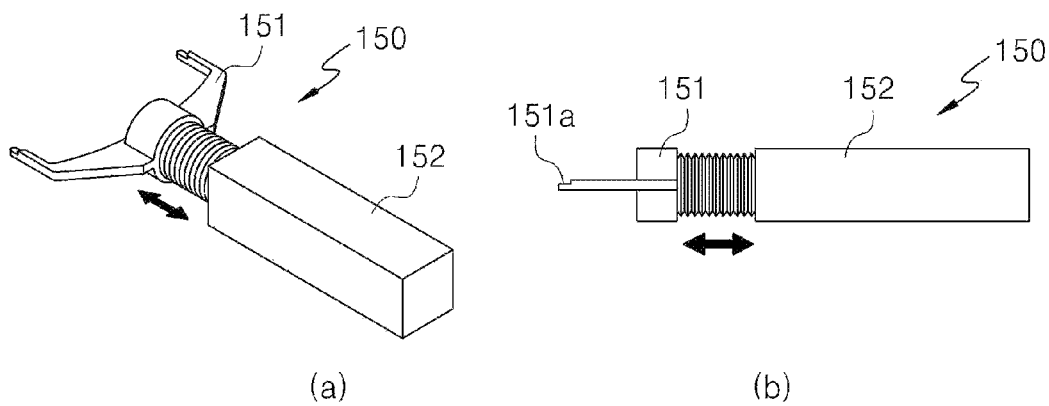
FIG. 3 is a view of a swap guide member in accordance with an exemplary embodiment.

FIG. 3 is a view of the swap guide member in accordance with an exemplary embodiment, (a) of FIG. 3 is a perspective view, and (b) of FIG. 3 is a side view.

Referring to FIG. 3, the swap guide member 150 may include a support part 151 supporting the substrate 10 and a driving part connected to the support part 151 to move the support part 151.

The support part 151 may be a portion by which the substrate 10 is supported. The support part 151 may be adjusted in length or moved by the driving part 152. The support part 151 may have one side having a fork shape. In this case, since the substrate 10 is stably supported, the substrate 10 may be stably supported by using a small area. Thus, a guide slot 121a that will be described below may be minimized in area. Also, when a distance between the plurality of swap guide members 150 decreases to support the substrate 10, the support part 151 may be disposed to avoid a connection bar 122 without interfering with the connection bar 122 of the substrate boat 120.

Also, an aligning stepped part 151a may be disposed on an end of the support part 151 on which the substrate 10 is supported. The aligning stepped part 151a may provide an alignment position so that the substrate 10 is stably supported and also supported at an accurate position. The substrate 10 may be supported by a lower end of the aligning stepped part 151a. A side surface of the substrate 10 may be hung on a sidewall of the aligning stepped part 151a to prevent the substrate 10 from being shaken in a horizontal direction (e.g., a left/right direction). Also, the aligning stepped part 151a may be formed to match a size and shape of the substrate 10. Thus, the substrate is supported by the lower end of the aligning stepped part 151a and then aligned.

The driving part 152 may be connected to the support part 151 to move the support part 151. Here, the driving part 152 may move the support part in the horizontal direction or adjust a length of the support part 151. The driving part 152 may include a linear motor (LM) system. A driving motor or an air cylinder may be used as a driving source of the driving part 152. The LM system may be provided in a ball screw type or a cylinder type.

For example, the swap guide member 150 may be basically constituted by an LM motor, a ball screw, and a magnetic seal or constituted by an air cylinder, a bush, and a bracket. The swap guide member 150 may move based on linear motion or rotation motion. Also, the swap guide member 150 may be formed of a metal material such as quartz, aluminum, or stainless steel (e.g., SUS316L). However, an exemplary embodiment is not limited to the structure and shape of the swap guide member 150. For example, the swap guide member 150 may have various structures and shapes.

Figure 4:
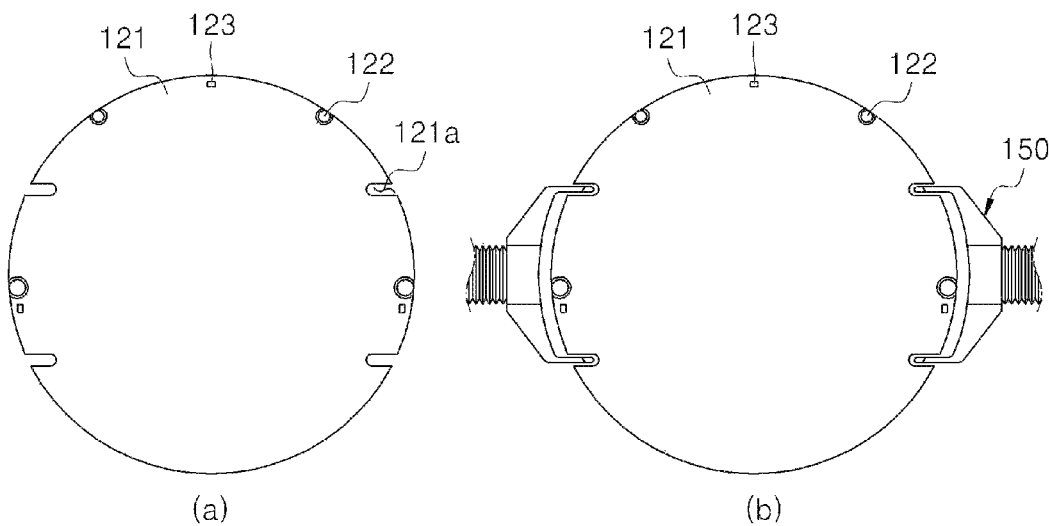
FIG. 4 is a view for explaining a guide slot of a partition plate in accordance with an exemplary embodiment.

FIG. 4 is a view for explaining the guide slot of the partition plate in accordance with an exemplary embodiment, (a) of FIG. 4 is a plan view of the partition plate having the guide slot, and (b) of FIG. 4 is a plan view illustrating a state in which the swap guide member 150 is disposed in the guide slot of the partition plate.

Referring to FIG. 4, the partition plate 121 may include a guide slot 121*a* through which at least a portion of the swap guide member 150 passes when the substrate boat 120 is elevated. At least a portion of the swap guide member 150 may pass through the guide slot 121*a* when the substrate boat 120 is elevated. Here, the support part 151 of the swap guide member 150 may pass through the guide slot 121*a*. Also, the guide slot 121*a* may provide a passing space of the swap guide member 150 so that the substrate boat 120 is elevated without moving the swap guide member 150 in the state in which the support 151 of the swap guide member 150 is provided in the loading space of the substrate boat 120 when the substrate boat 120 is elevated. Thus, in the state in which the substrate is supported by the swap guide member 150, the substrate boat 120 may ascend to place the substrate in the loading space of the substrate boat 120. Thus, as the substrate boat 120 ascends, the swap guide member 150 may provide the substrate into the next loading space.

Also, the loading position of the substrate 10 may be maximally lowered in the loading space of the substrate boat 120 through the guide slot 121*a*. As the loading position of the substrate 10 is maximally lowered, the substrate 10 may be placed on a top surface of the partition plate 121. That is, since the swap guide member 150 is disposed in the same line as the partition plate 121 through the guide slot 121*a* or disposed under the partition plate 121, the substrate 10 may be placed on the top surface of the partition plate 121.

Thus, a sufficient space above the substrate 10, through which the process gas flows along the entire surface of the substrate 10 without changing a height of the loading space of the substrate boat 120 or the total height of the substrate boat 120 may be secured. Also, the flow of the process gas that is participated in the substrate processing process may be improved to improve the process uniformity on the entire surface of the substrate 10. Also, costs required for increasing the height of the loading space and the total height of the substrate boat to secure the sufficient space above the substrate 10 may be reduced.

Also, when the substrate 10 is loaded in the loading space of each stage through the guide slot 121*a*, the swap guide member 150 may not move all the time. Thus, the loading process of the substrate 10 may be simplified.

Thus, the substrate 10 carried into the pre-chamber 112 through the swap guide member 150 may be primarily supported, and the substrate boat 120 may be elevated while a portion of the swap guide member 150 passes through the guide slot 121*a*. As a result, the substrate 10 may be loaded at a low position in the loading space by the guide slot 121*a* without moving the swap guide member 150, and the sufficient space above the substrate 10, through which the process gas flows along the entire surface of the substrate 10, may be secured. Also, the swap guide member 150 may be provided into the next loading space of the substrate boat 120 without moving the swap guide member 150, and thus, a time required for the loading process may be reduced.

Also, the guide slot 121*a* may have an area corresponding to 0.1% to 10% of that of the partition plate 121. When the guide slot 121*a* has an area less by 0.1% than that of the partition plate 121, it may be difficult to allow a portion of the swap guide member 150 to pass. Also, although the portion of the swap guide member 150 passes, since an area for supporting the substrate 10 is reduced, the substrate 10 may not be stably supported. For example, when the guide slot 121*a* has a small area, since it is difficult to align the swap guide member 150 with the guide slot 121*a*, the passing of the swap guide member 150 may be difficult due to the misalignment of the swap guide member 150 and the guide slot 121*a*. Thus, the loading process of the substrate 10 may be malfunctioned due to the misalignment of the swap guide member 150 and the guide slot 121*a*. On the other hand, when the guide slot 121*a* has an area greater by 10% than that of the partition plate 121, when the substrate processing process is performed, the process gas may affect the substrate 10 disposed at the corresponding position and substrates disposed above and under the substrate through the guide slot 121*a*. Thus, since it is difficult to independently perform the substrate processing process in each of the processing spaces, the substrate processing may not be uniformly performed on the plurality of substrates 10 within the substrate boat 120. Thus, the usage of the partition plate 121 may be meaningless, and the effect of the present disclosure for solving the limitation, in which it is difficult to secure the space above the substrate, through the partition plate 121 may be deteriorated.

Figure 5:
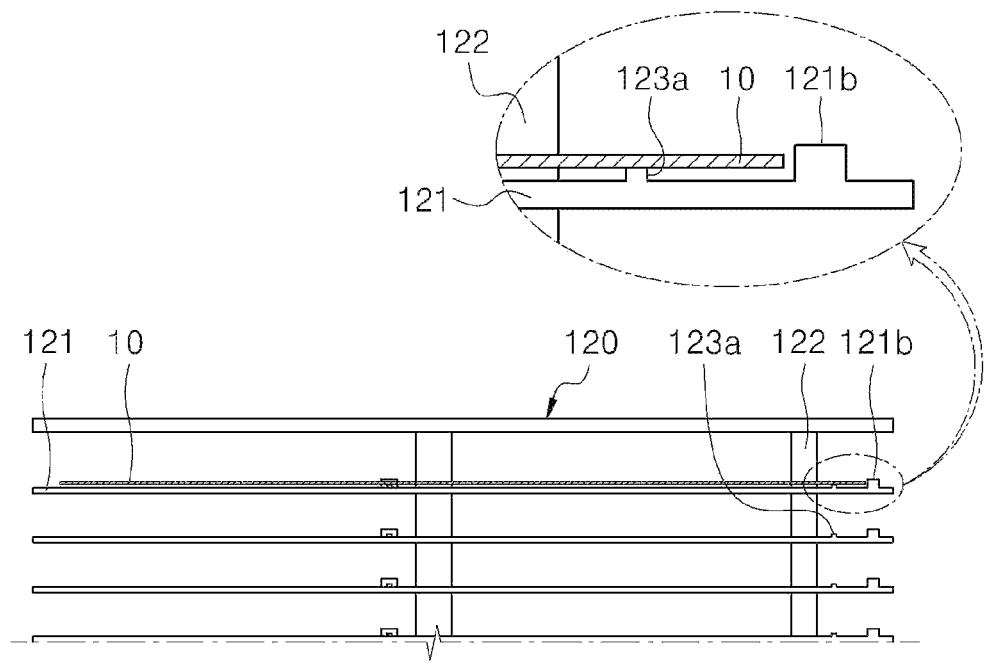
FIG. 5 is a view of a substrate support tip of a substrate boat in accordance with an exemplary embodiment.
Figure 5:
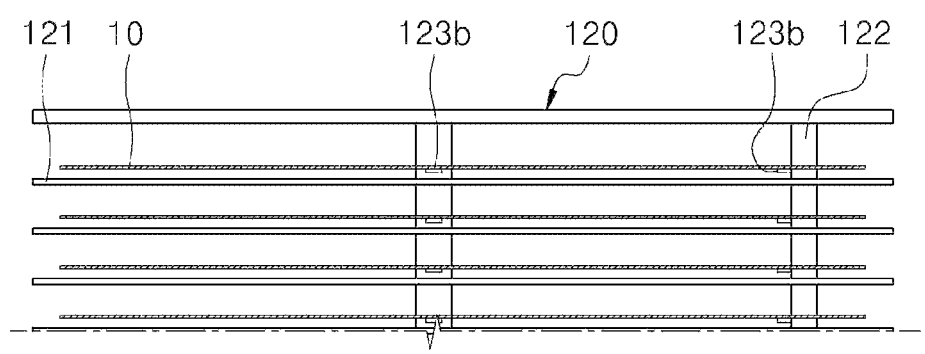

FIG. 5 is a view of a substrate support tip of the substrate boat in accordance with an exemplary embodiment, (a) of FIG. 5 is a view of the substrate support tip disposed on the partition plate, and (b) of FIG. 5 is a view of the substrate support tip disposed on the connection bar.

Referring to FIG. 5, the partition plate 121 or the connection bar 122 may include a substrate support tip 123 on which the substrate 10 transferred from the swap guide member 150 is placed. The substrate 10 transferred (or swapped) from the swap guide member 150 may be placed on the substrate support tip 123. Here, the swap guide member 150 may be elevated to place the substrate 10 on the substrate support tip 123, or the substrate boat 120 may be elevated to place the substrate 10 on the substrate support tip 123. Here, if the swap guide member 150 has the horizontal moving function and the elevation function, the swap guide member 150 may be completed in structure. Thus, to realize a simple structure, the substrate boat 120 may ascend by using the elevation function of the substrate boat 120 to place the substrate 10 on the substrate support tip 123.

As illustrated in (a) of FIG. 5, a substrate support tip 123*a* disposed on an edge of the partition plate 121 may be adjusted in height as necessary. Here, the height may be determined to match the process according to a thickness and shape of a grown layer to be deposited. Also, the substrate support tip 123*a* may be adjusted in position according to a thickness or shape of the substrate 10. Here, the height may be adjusted according to the thickness of the substrate 10, and the supporting position may be adjusted according to the shape of the substrate 10. Also, the substrate support tip 123*a* may be provided in the form of a spot-type protrusion to prevent the substrate 10 from being bonded to the partition plate 121 during the substrate processing process.

When the substrate support tip 123*a* is disposed on the edge of the partition plate 121, the partition plate 121 may further include an aligning protrusion 121*b* so that the substrate 10 is stably supported and aligned. The aligning protrusion 121*b* may provide a supporting position so that the substrate 10 is aligned. A side surface of the substrate 10 may be hung on the aligning protrusion 121*b* to prevent the substrate 10 from horizontally moving during the substrate processing process.

As illustrated in (b) of FIG. 5, a substrate support tip 123*b* disposed on the connection bar 122 may be adjusted in height as necessary. Here, the height may be determined to match the process according to a thickness and shape of a grown layer to be deposited. Also, the substrate support tip 123*b* may be adjusted in position according to a thickness or shape of the substrate 10. Here, the height may be adjusted according to the thickness of the substrate 10, and the supporting position may be adjusted according to the shape of the substrate 10. Also, the substrate support tip 123*b* may be provided in the form of a spot-type protrusion (not shown) formed on an end of a tip to prevent the substrate 10 from being bonded to the substrate support tip 123*b* during the substrate processing process.

Sine the lowering of the loading position of the substrate 10 is limited by the thickness of the substrate support tip 123*b*, the substrate support tip 123*a* may be disposed on the edge of the partition plate 121. However, the exemplary embodiment is not limited thereto. For example, the substrate support tip 123 may be adequately selected according to a required height of the upper space.

The substrate processing apparatus 100 in accordance with an exemplary embodiment may further include a cover plate 124 that is disposed under the substrate boat 120 to block a path between the pre-chamber 112 and the process chamber 111 by an ascending of the substrate boat 120, thereby separating the process chamber 111 from the pre-chamber 112. The cover plate 124 may have a circular plate shape and a diameter greater than that of the partition plate 121. The cover plate 124 may be disposed under the substrate boat 120 to seal the process chamber 111 by the ascending of the substrate boat 120. That is, when the substrate processing process is performed, the opened lower portion of the reaction tube 114 or the external tube (not shown) may be closed. Also, a sealing member 124*a* having an O-ring shape may be disposed between the cover plate 124 and the external tube (not shown) or between the cover plate 124 and the reaction tube 114. Thus, when the substrate processing process is performed, the inside of the reaction tube 114 may be isolated from the pre-chamber 112 to prevent the process gas within the process chamber 111 from being introduced into the pre-chamber 112 or foreign substances within the pre-chamber 112 from being introduced into the process chamber 111. However, an exemplary embodiment is not limited to the structure and shape of the cover plate 124. For example, the cover plate 124 may have various structures and shapes.

Also, a rotation driving unit 161 may be provided under the substrate boat 120. The rotation driving unit 161 may be disposed under the substrate boat 120 to rotate the substrate boat 120. Here, the rotation driving unit 160 may rotate the substrate boat 120 with respect to a central axis in a vertical direction of the partition plate 121. When the substrate processing process is performed, the process gas supplied to one side of the reaction tube 114 may pass through the substrate 10 loaded in the substrate boat 120 and then be discharged to the other side of the reaction tube 114. Here, when the substrate boat 120 rotates by the operation of the rotation driving part 161, the gases that will pass through the substrate boat 120 may be mixed with each other and thus uniformly distributed on the entire surface of the substrate 10. Thus, the layer deposited on the substrate 10 may be improved in quality.

The elevation driving unit 162 may be disposed under one of the pre-chamber 112 and the process chamber 111. The elevation driving unit 191 may be connected to a lower portion of the substrate boat 120 by using a shaft extending in a vertical to vertically elevate the substrate boat 120. The shaft may support the substrate boat 120. For example, the substrate boat 120 may move downward by the operation of the elevation driving unit 162 and then be disposed in (or at the loading position) of the pre-chamber 112. The substrate 10 loaded from the transfer chamber 200 to the pre-chamber 112 may be loaded into the substrate boat 120 that is disposed in the pre-chamber 112. Then, when the plurality of substrates are completely loaded into the substrate boat 120, the substrate boat 120 may move upward by the elevation driving unit 162 to move to the process chamber 111 (the process position). Thus, the epitaxial process may be performed on the substrate 10 in the accommodation space of the reaction tube 114.

The heating unit 171 is provided in the process chamber 111 and disposed to surround a side surface and an upper portion of the reaction tube 114. The heating unit 171 may provide thermal energy to the reaction tube 114 to heat the inner space of the reaction tube 114. Also, the heating unit may adjust a temperature of the inner space of the reaction tube 114 to a temperature at which the epitaxial process is enabled.

Figure 6:
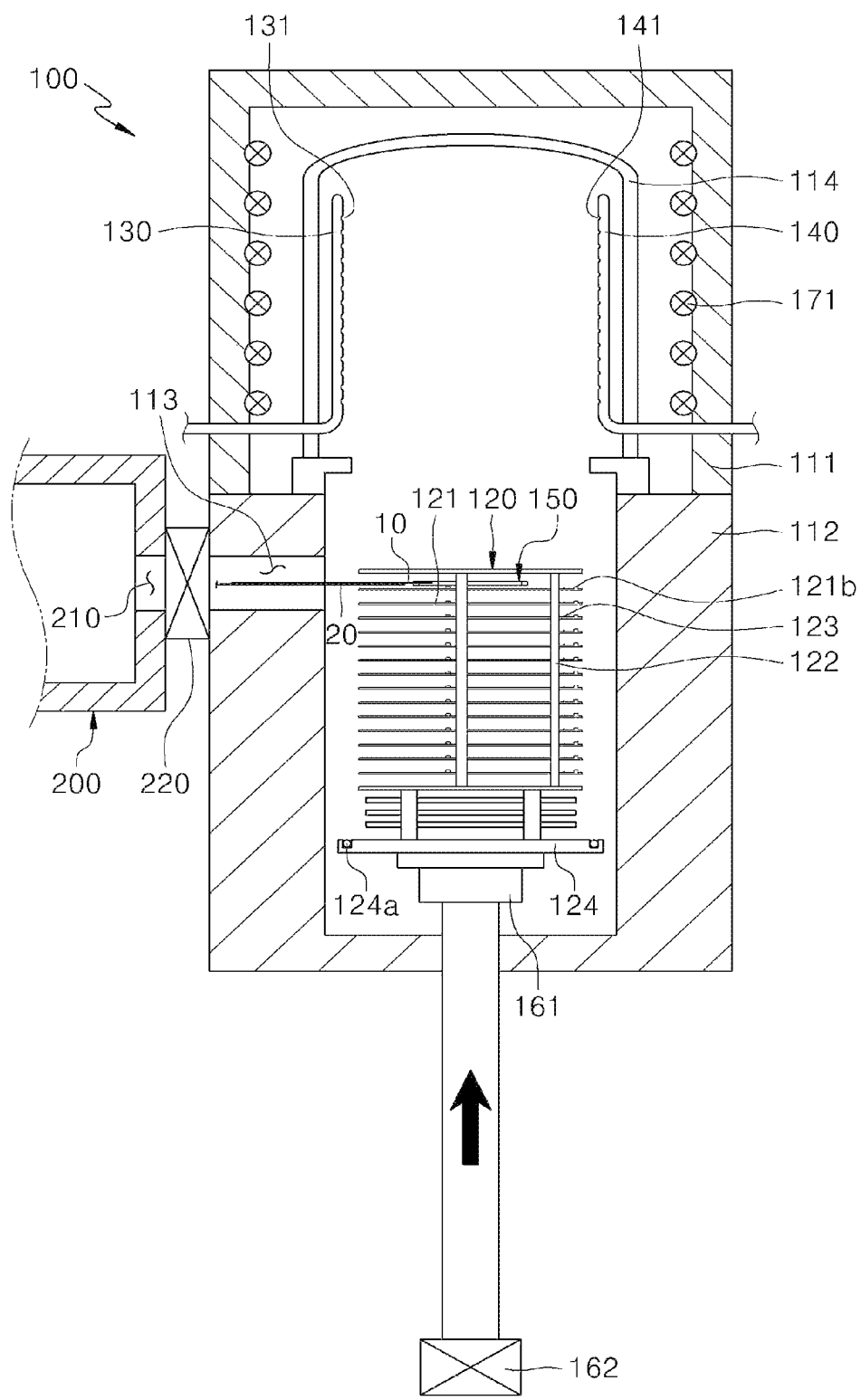
FIG. 6 is a view illustrating a state in which a substrate is carried into a pre-chamber in the substrate processing method in accordance with another exemplary embodiment.
Figure 7:
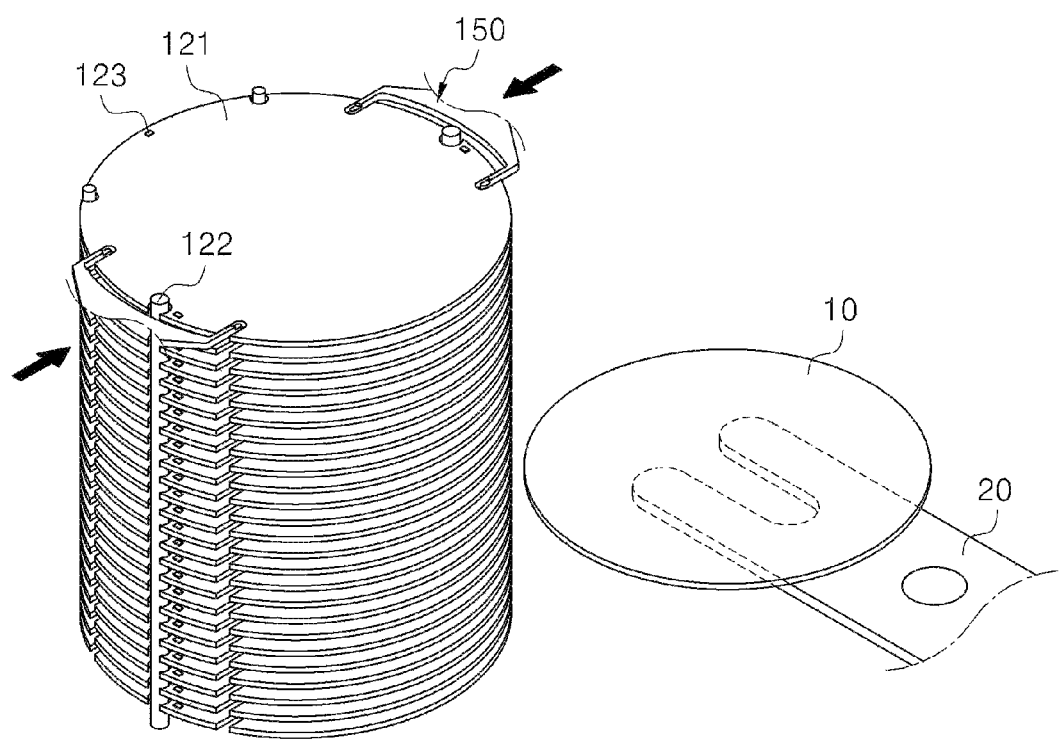
FIG. 7 is a schematic view illustrating a state in which a distance between a plurality of swap guide members is narrowed in the substrate processing method in accordance with another exemplary embodiment.
Figure 8:
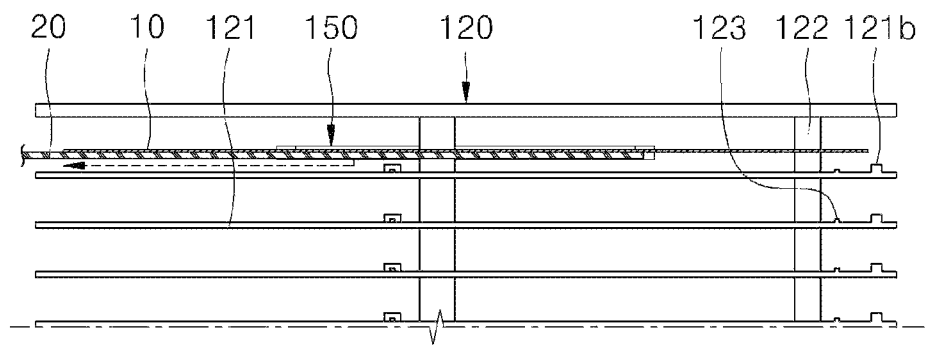
FIG. 8 is a view illustrating a state in which a substrate is supported on the plurality of swap guide members in the substrate processing method in accordance with another exemplary embodiment.
Figure 9:
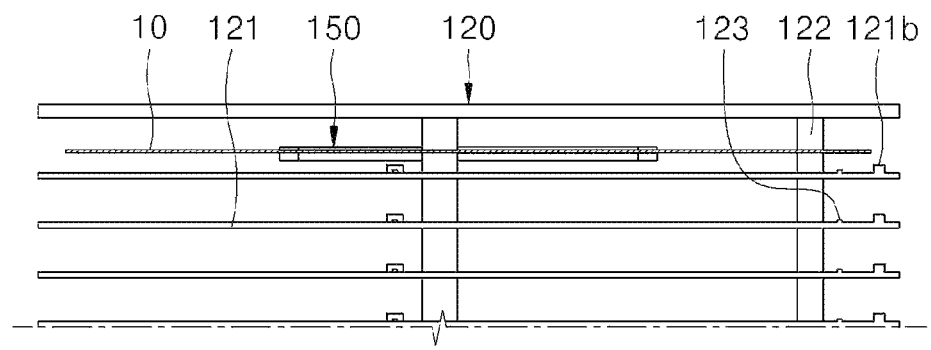
FIG. 9 is a view illustrating a state in which an end-effector transfers a substrate on the plurality of swap guide members and then is removed in the substrate processing method in accordance with another exemplary embodiment.
Figure 10:
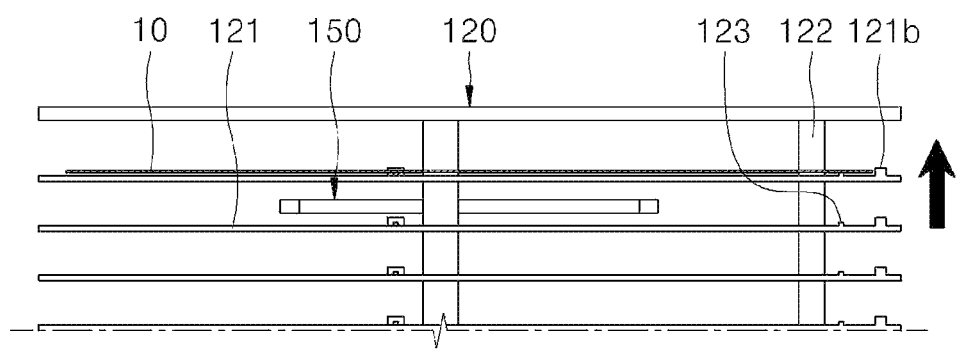
FIG. 10 is a view illustrating a state in which a substrate boat ascends in the substrate processing method in accordance with another exemplary embodiment.
Figure 11:
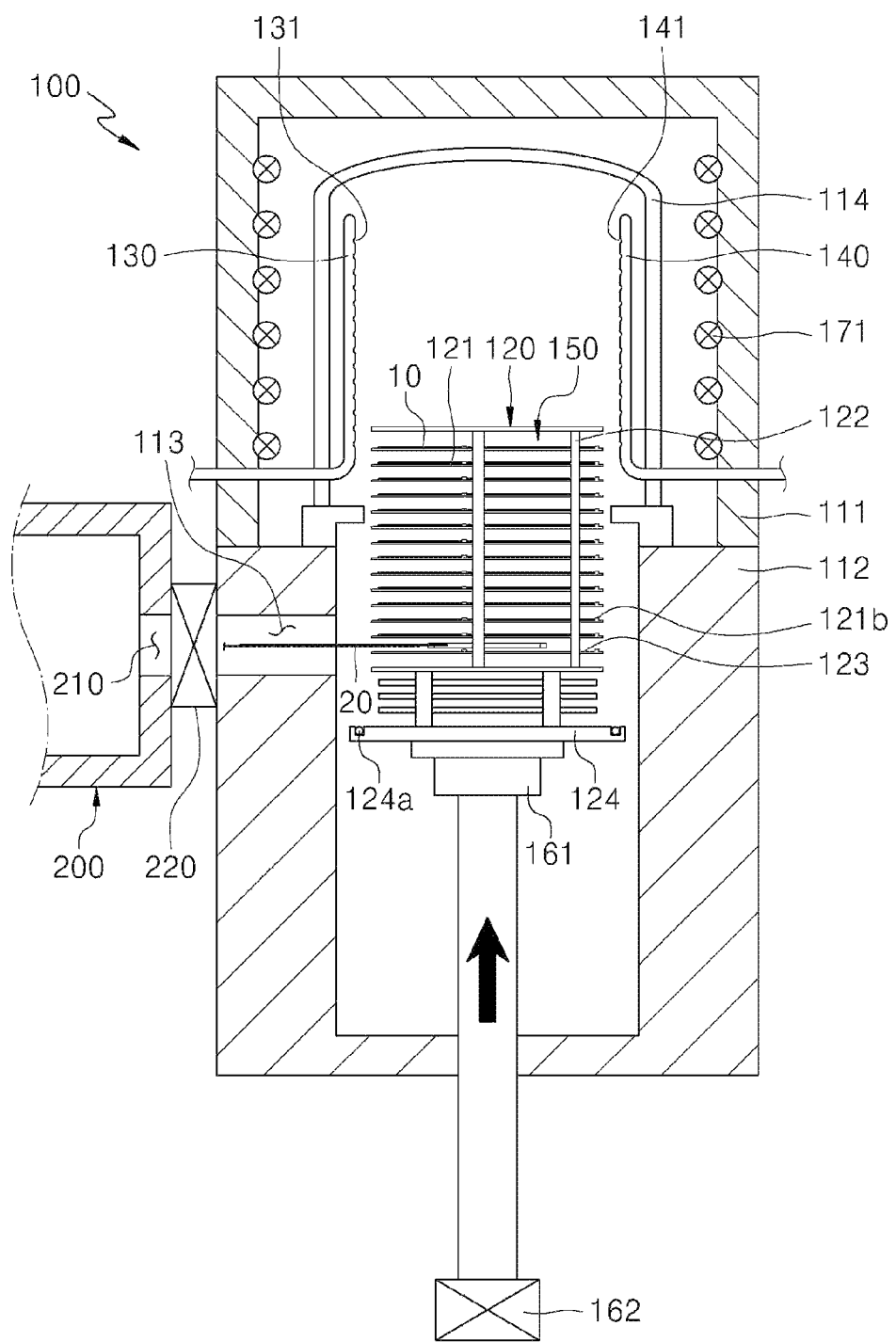
FIG. 11 is a view illustrating a state in which a substrate is loaded in the last lading space of the substrate boat in the substrate processing method in accordance with another exemplary embodiment.
Figure 12:
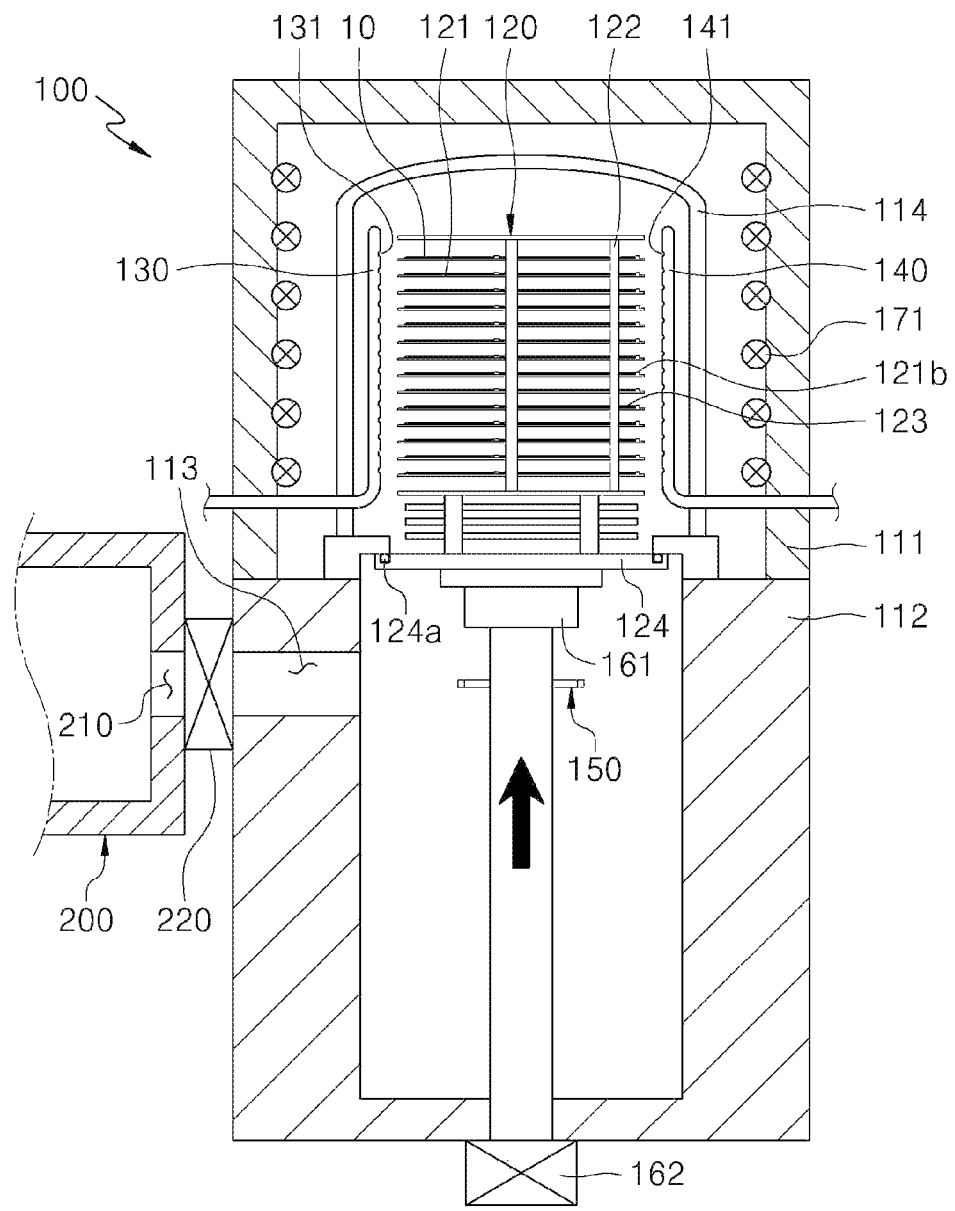
FIG. 12 is a view illustrating a state in which the substrate boat moves to a process chamber in the substrate processing method in accordance with another exemplary embodiment.

FIGS. 6 to 12 are views of a substrate processing method in accordance with another exemplary embodiment. FIG. 6 is a view illustrating a state in which a substrate is carried into a pre-chamber in the substrate processing method in accordance with another exemplary embodiment, FIG. 7 is a schematic view illustrating a state in which a distance between a plurality of swap guide members is narrowed in the substrate processing method in accordance with another exemplary embodiment, FIG. 8 is a view illustrating a state in which a substrate is supported on the plurality of swap guide members in the substrate processing method in accordance with another exemplary embodiment, FIG. 9 is a view illustrating a state in which an end-effector transfers a substrate on the plurality of swap guide members and then is removed in the substrate processing method in accordance with another exemplary embodiment, FIG. 10 is a view illustrating a state in which a substrate boat ascends in the substrate processing method in accordance with another exemplary embodiment, FIG. 11 is a view illustrating a state in which a substrate is loaded in the last lading space of the substrate boat in the substrate processing method in accordance with another exemplary embodiment, and FIG. 12 is a view illustrating a state in which the substrate boat moves to a process chamber in the substrate processing method in accordance with another exemplary embodiment.

The substrate processing method in accordance with another exemplary embodiment will be described with reference to FIGS. 6 to 12. In the description of the substrate processing method in accordance with another exemplary embodiment, duplicated descriptions with respect to the substrate processing apparatus 100 in accordance with an exemplary embodiment will be omitted.

In the substrate processing method in accordance with another exemplary embodiment, the substrate processing method using a substrate processing apparatus 100, which includes a pre-chamber 112 into which a substrate 10 is carried, a process chamber 111 communicating with the pre-chamber 112 and in which a substrate processing process is performed, a substrate boat 120 in which the substrate 10 is loaded into loading spaces that are partitioned in multi stages, and a plurality of swap guide member 150 placing the substrate 10 in the loading space, may include a process (S100) of carrying the substrate 10 into the pre-chamber 112, a process (S200) of transferring the substrate 10 on the plurality of swap guide members 150, a process (S300) of lifting the substrate boat 120 to place the substrate 10 in the loading space, and a process (S400) of moving the substrate boat 120 to the process chamber 111.

The above-described processes may not be time-sequentially performed. At least one process (e.g., S100 to S300) of the above-described processes may be performed two times or more.

First, as illustrated in FIG. 6, the substrate 10 is carried into the pre-chamber 112 (S100). Here, the substrate 10 may be carried into the pre-chamber 112 by an end-effector 20 of a transfer module.

Next, the substrate 10 is transferred on the plurality of swap guide member 150 (S200). As illustrated in FIG. 7, the substrate 10 may be transferred to the plurality of swap guide member 150 by the end-effector 20 of the transfer module. As illustrated in FIG. 8, the carried substrate 10 may be supported on the plurality of swap guide member 150. When the substrate 10 is supported, as illustrated in FIG. 9, the end-effector 20 may be removed from the inside of the pre-chamber 112.

The substrate processing method may further include a process (S50) of adjusting a distance between the plurality of swap guide members 150. The process (S50) of adjusting the distance between the plurality of swap guide members may be performed before the process (S200) of transferring the substrate or before the process (400) of moving the substrate boat.

When the process (S50) is performed before the process (S200) of transferring the substrate, as illustrated in FIG. 7, the distance between the plurality of swap guide members 150 may be adjusted to support the substrate 10 carried and transferred into the pre-chamber 112 by the end-effector 20 of the transfer module to reduce the distance between the plurality of swap guide members 150 (S150). Since the distance between the plurality of swap guide members 150 is reduced to provide the plurality of swap guide members 150 into the loading space, the substrate 10 carried into the pre-chamber 112 may be supported by the swap guide members 150. The swap guide members 150 may be provided in the pre-chamber 112 and move in a horizontal direction. Here, the distance between the swap guide members 150 may be reduced to primarily support the substrate 10 carried into the pre-chamber 112 and place the substrate 10 in the loading space that is partitioned by the plurality of partition plates 121, thereby loading the substrate 10 in the substrate boat 120.

Then, as illustrated in FIG. 10, the substrate 10 is placed in the loading space of the substrate boat 120 by lifting the substrate boat 120 (S300). Here, a loading position of the substrate 10 may be maximally lowered. When the loading position of the substrate 10 is lowered, a space above the substrate 10, through which the process gas uniformly flows along an entire surface of the substrate 10, may be secured. Thus, the flow of the process gas that is participated in the substrate processing process may be improved to improve process uniformity on the entire surface of the substrate 10.

The substrate boat 120 may further include a plurality partition plates 121 that partition the loading space and a plurality of connection bars 122 supporting the plurality of partition plates 121. A plurality of insertion grooves may be formed in the plurality of connection bars 122. Thus, since the plurality of partition plates 121 are respectively inserted into the plurality of insertion grooves, the plurality of connection bars 122 and the plurality of partition plates 121 may be coupled to each other. The plurality of connection bars 122 may connect the plurality of partition plates 121 to each other. Here, the plurality of connection bars 122 may stably support the plurality of partition plates 121. Thus, while the substrate processing process is performed, the connection bars 122 may prevent the plurality of partition plates 121 from being tilted and each of the loading spaces from being deformed. Also, the plurality of connection bars 122 may be integrally coupled to components of the substrate boat 120 such as the plurality of partition plates 121.

The plurality of partition plates 121 may define a plurality of individual loading spaces in which the plurality of substrates 10 are respectively loaded so that the plurality of substrates 10 are individually processed in each of the loading spaces. That is, the substrate boat 120 may have multi-stage loading spaces in a vertical direction, and one substrate 10 may be loaded in each of the loading spaces. Thus, the regions for processing the substrate 10 may be individually defined in the loading space of the substrate boat 120 to prevent the process gas injected onto each of the substrates 10 from having an influence on upper and lower substrates. Ceramic, quartz, synthesis quartz, and the like may be used as a material of each of the partition plates 121.

In the process (S300) of lifting the substrate boat, the substrate 10 may be placed on a substrate support tip 123 formed on the plurality of connection bars 122 or the plurality of partition plates 121. When the substrate 10 is placed on the substrate support tip 123, bonding of the substrate 10 to the partition plates 121 while the processing process is performed may be prevented.

Thus, in a state in which the lower space through which the end-effector 20 of the transfer module gets out of the loading space, the substrate carried in the pre-chamber 112 may be primarily supported through the swap guide member 150. After the end-effector 20 of the transfer module gets out of the loading space, the substrate may be placed in the loading space of the substrate boat 120. Thus, the loading position of the substrate 10 may be lowered in the loading space of the substrate boat 120. Since the space under the substrate 10 has only to have a distance corresponding to a thickness of each of the swap guide members 150, a sufficient space above the substrate 10, through which the process gas flows along the entire surface of the substrate 10 without changing a height of the loading space of the substrate boat 120 or the total height of the substrate boat 120 may be secured. Thus, the flow of the process gas that is participated in the substrate processing process may be improved to improve the process uniformity on the entire surface of the substrate 10. Also, costs required for increasing the height of the loading space and the total height of the substrate boat to secure the sufficient space above the substrate 10 may be reduced.

Also, each of the plurality of partition plates 121 may include a guide slot 121a through which at least a portion of the swap guide members 150 passes. The guide slot 121a may provide a passing space of the swap guide member 150 so that the substrate boat 120 is elevated without moving the swap guide member 150 in the state in which the at least a portion of the swap guide members 150 is provided in the loading space of the substrate boat 120 when the substrate boat 120 is elevated. Thus, in the state in which the substrate 10 is supported by the swap guide member 150, the substrate 10 is placed in the loading space of the substrate boat 120 by lifting the substrate boat 120. And the swap guide member 150 may be provided into next the loading space by an ascending of the substrate boat 120.

In the process (S300) of lifting the substrate boat, each of the plurality of swap guide members 150 may pass through the guide slot 121*a* by the ascending of the substrate boat 120. When the substrate 10 is placed (or loaded) in the loading space of each stage through the guide slot 121*a*, the swap guide member 150 may not move. Thus, the loading process of the substrate 10 may be simplified. Also, the loading position of the substrate 10 may be maximally lowered in the loading space of the substrate boat 120 through the guide slot 121*a*. As the loading position of the substrate 10 is maximally lowered, the substrate 10 may be placed on a top surface of the partition plate 121. That is, since the swap guide member 150 is disposed in the same line as the partition plate 121 through the guide slot 121*a* or disposed under the partition plate 121, the substrate 10 may be placed on the top surface of the partition plate 121.

The substrate processing method may further include a process (S310) of lifting the substrate boat 120 to locate the plurality of swap guide members 150 in a loading space different from the loading space in which the substrate 10 is placed.

Also, the substrate boat 120 ascends to locate the plurality of swap guide members 150 in a loading space different from the loading space in which the substrate 10 is placed (S310). Here, the substrate 10 may be placed in the loading space of the substrate boat 120, and then, the substrate boat 120 may further ascend to locate the plurality of swap guide members 150 in a loading space below the loading space in which the substrate is placed. In this case, the substrate boat 120 may ascend only one time to successively perform the processes S300 to S310. Thus, a time taken to load the substrate 10 in the substrate boat 120 may be reduced. The substrates 10 may be successively loaded into the loading spaces, and thus, as illustrated in FIG. 11, the plurality of substrates may be loaded into the first substrate boat 120 to the last substrate boat 120.

In the process (S310) of locating the substrates in the loading spaces different from each other, the plurality of swap guide members 150 may pass through the guide slot 121*a* by the elevation of the substrate boat 120. When the substrate 10 is loaded in the loading space of each stage through the guide slot 121*a*, the swap guide member 150 may not move. Thus, the loading process of the substrate 10 may be simplified.

Thus, the substrate 10 carried into the pre-chamber 112 through the swap guide member 150 may be primarily supported, and the substrate boat 120 may be elevated while a portion of the swap guide member 150 passes through the guide slot 121*a*. As a result, the substrate 10 may be loaded at a low position in the loading space by the guide slot 121*a* without moving the swap guide member 150, and the sufficient space above the substrate 10, through which the process gas flows along the entire surface of the substrate 10, may be secured. Also, the swap guide member 150 may be provided into the next loading space of the substrate boat 120 without moving the swap guide member 150, and thus, a time required for the loading process may be reduced.

After the substrate 10 is loaded in the substrate boat 120, the substrate boat 120 moves to the process chamber 111 (S500). Here, as illustrated in FIG. 12, after the plurality of substrates 10 are completely loaded into the loading spaces of the substrate boat 120, the substrate boat 120 may be elevated to move to the process chamber 111. When the substrate boat 120 moves to the process chamber 111, the substrate 10 loaded in the substrate boat 120 to move may be processed in the process chamber 111.

When the process (S50) of adjusting the distance between the plurality of swap guide members is performed before the process (S400) of moving the substrate boat, the distance between the plurality of swap guide members 150 may increase to move the plurality of swap guide members 150 to the outside of the substrate boat 120 (S350). When the cover plate 124 that seals the process chamber 111 by the ascending of the substrate boat 120 is used, the distance between the plurality of swap guide members 150 may increase to prevent the plurality of swap guide members 150 from interfering with the cover plate 124 and then to move the plurality of swap guide members 150 to the outside of the substrate boat 120. Also, to prevent the upper and lower plates of the substrate boat 120 from interfering with each other, the distance between the plurality of swap guide members 150 may increase to move the plurality of swap guide members 150 to the outside of the substrate boat 120.

As described above, the substrate boat may ascend after supporting the substrate loaded on the swap guide member to place the substrate in the loading space of the substrate boat, and thus, the space above the substrate may be secured without changing the height of the loading space and the total height of the substrate boat. Thus, the flow of the process gas that is participated in the substrate processing process may be improved to improve the process uniformity on the entire surface of the substrate. Also, costs required for increasing the height of the loading space and the total height of the substrate boat may be reduced. Also, the guide slot may be defined in the partition plate to the plurality of substrates in the substrate boat by only elevating the substrate boat without moving the swap guide member when the swap guide member is disposed to correspond to the guide slot. Thus, the substrate may be loaded in the substrate boat without the complicate structure for elevating the swap guide member, and also, the space above the substrate may be sufficiently secured. In addition, since the gas is independently supplied onto each of the substrates by the partition plate, the amount of gas supplied according to the situation of each of the substrates may be controlled. Therefore, the processing process may be performed on each of the substrates under the optimal condition to improve the quality of the grown layer.

In the substrate processing apparatus in accordance with the exemplary embodiment, the substrate boat may ascend after supporting the substrate loaded on the swap guide member to place the substrate in the loading space of the substrate boat, and thus, the space above the substrate may be secured without changing the height of the loading space and the total height of the substrate boat. Thus, the flow of the process gas that is participated in the substrate processing process may be improved to improve the process uniformity on the entire surface of the substrate. Also, costs required for increasing the height of the loading space and the total height of the substrate boat may be reduced.

Also, the guide slot may be defined in the partition plate to the plurality of substrates in the substrate boat by only elevating the substrate boat without moving the swap guide member when the swap guide member is disposed to correspond to the guide slot. Thus, the substrate may be loaded in the substrate boat without the complicate structure for elevating the swap guide member, and also, the space above the substrate may be sufficiently secured.

In addition, since the gas is independently supplied onto each of the substrates by the partition plate, the amount of gas supplied according to the situation of each of the substrates may be controlled. Therefore, the processing process may be performed on each of the substrates under the optimal condition to improve the quality of the grown layer.

Although embodiments have been described with reference to a number of illustrative embodiments thereof, the embodiments are not limited to the foregoing embodiments, and thus, it should be understood that numerous other modifications and embodiments can be devised by those skilled in the art that will fall within the spirit and scope of the principles of this disclosure. Hence, the real protective scope of the present invention shall be determined by the technical scope of the accompanying claims.

What is claimed is:

1. A substrate processing apparatus comprising:
   a pre-chamber into which a substrate is configured to be carried through a gate slit;
   a process chamber communicating with the pre-chamber and in which a substrate processing process is performed;
   a substrate boat comprising a plurality of partition plates having a circular plate shape to partition a loading space into which the substrate is configured to be loaded and a plurality of connection bars supporting the partition plates, and configured to elevate in the pre-chamber and the process chamber;
   a gas supply unit comprising a plurality of injection nozzles and configured to supply a process gas to the substrate through the plurality of injection nozzles provided in the process chamber;
   an exhaust unit comprising a plurality of suction holes and configured to exhaust a gas through the plurality of suction holes provided in the process chamber; and
   a plurality of swap guide members respectively provided inside the pre-chamber in a direction that crosses a carrying direction of the substrate passing through the gate slit, and configured to support the substrate carried into the pre-chamber by an end-effector of a transfer module and then place the supported substrate on a substrate support tip formed in each of the plurality of partition plates or connection bars through lifting of the substrate boat,
   wherein each of the plurality of swap guide members comprises:
      a support part configured to support an edge of the substrate; and
      a linear motor (LM) system connected to the support part and configured to move the support part horizontally in the direction crossing the carrying direction of the substrate, thereby adjusting a distance between the plurality of swap guide members,
   wherein the plurality of connection bars are provided symmetrically with respect to the carrying direction of the substrate from the gate slit and include a first pair of connection bars provided symmetrically with respect to the carrying direction and a second pair of connection bars provided symmetrically with respect to the carrying direction, wherein the first pair of connection bars is closer to the gate slit than the second pair of connection bars and wherein a width between the connection bars in the first pair of connection bars is larger than a width between the connection bars in the second pair of connection bars and is also larger than a width of the substrate, and
   wherein the support part has a fork at one side thereof on which the substrate is supported such that each of the connection bars in the first pair of connection bars is situated within the width of the corresponding fork when supporting the substrate on the support part, and comprises an aligning stepped part providing a side wall opposite a side surface of the substrate on an end of the fork.

2. The substrate processing apparatus of claim 1, wherein each of the partition plates comprises a guide slot through which at least a portion of each of the plurality of swap guide members passes when the substrate boat is elevated.

3. The substrate processing apparatus of claim 2, wherein the guide slot has an area corresponding to 0.1% to 10% of an area of the partition plate.

4. The substrate processing apparatus of claim 1, further comprising a cover plate disposed under the substrate boat to block a path between the pre-chamber and the process chamber by an ascending of the substrate boat.

5. The substrate processing apparatus of claim 1, wherein the plurality of swap guide members are disposed at a height corresponding to the gate slit.

6. A substrate processing method using the substrate processing apparatus of claim 1, the substrate processing method comprising:
   carrying the substrate into the pre-chamber;
   transferring the substrate on the plurality of swap guide members;
   lifting the substrate boat to place the substrate in the loading space; and
   moving the substrate boat to the process chamber.

7. The substrate processing method of claim 6, wherein, in the lifting of the substrate boat, the substrate is placed on a substrate support tip formed on each of the plurality of connection bars or the plurality of partition plates.

8. The substrate processing method of claim 7, wherein each of the plurality of partition plates comprises a guide slot through which at least a portion of the plurality of swap guide members passes, and
in the lifting of the substrate boat, each of the plurality of swap guide members passes through the guide slot by an ascending of the substrate boat.

9. The substrate processing method of claim 6, further comprising adjusting a distance between the plurality of swap guide members.

* * * * *